United States Patent
Haruna

(10) Patent No.: US 12,101,872 B2
(45) Date of Patent: Sep. 24, 2024

(54) SHIELD PRINTED WIRING BOARD WITH GROUND MEMBER AND GROUND MEMBER

(71) Applicant: TATSUTA ELECTRIC WIRE & CABLE CO., LTD., Higashiosaka (JP)

(72) Inventor: Yuusuke Haruna, Kizugawa (JP)

(73) Assignee: TATSUTA ELECTRIC WIRE & CABLE CO., LTD., Higashiosaka (JP)

( * ) Notice: Subject to any disclaimer, the term of this patent is extended or adjusted under 35 U.S.C. 154(b) by 0 days.

(21) Appl. No.: 18/044,436

(22) PCT Filed: Sep. 16, 2021

(86) PCT No.: PCT/JP2021/034019
§ 371 (c)(1),
(2) Date: Mar. 8, 2023

(87) PCT Pub. No.: WO2022/059726
PCT Pub. Date: Mar. 24, 2022

(65) Prior Publication Data
US 2023/0371168 A1  Nov. 16, 2023

(30) Foreign Application Priority Data
Sep. 18, 2020  (JP) .................................. 2020-157507

(51) Int. Cl.
*H05K 1/02* (2006.01)
*H01R 4/04* (2006.01)

(52) U.S. Cl.
CPC .............. *H05K 1/0215* (2013.01); *H01R 4/04* (2013.01); *H05K 1/023* (2013.01); *H05K 2201/0715* (2013.01)

(58) Field of Classification Search
CPC .................................................... H05K 1/0215
See application file for complete search history.

(56) References Cited

U.S. PATENT DOCUMENTS

2015/0305144 A1* 10/2015 Tajima ................. H05K 1/0218
 174/350
2016/0007444 A1* 1/2016 Watanabe ............ H05K 1/0281
 174/254

(Continued)

FOREIGN PATENT DOCUMENTS

JP  2003086907 A  3/2003
JP  2010168518 A  8/2010

(Continued)

OTHER PUBLICATIONS

International Search Report issued in International Application No. PCT/JP2021/034019, dated Nov. 9, 2021.

(Continued)

*Primary Examiner* — Hung V Ngo
(74) *Attorney, Agent, or Firm* — United IP Counselors, LLC; Kenneth M. Fagin

(57) ABSTRACT

A shielded printed wiring board with a ground member wherein even though a thermal load is applied, the connection stability between the electroconductive particles of a ground member and the shielding layer of a shielding film is hardly deteriorated is provided. A shielded printed wiring board with a ground member of the present invention is a shielded printed wiring board with a ground member, including: a substrate film formed by sequentially stacking a base film, a printed circuit including a ground circuit, and an insulating film; a shielding film including a shielding layer and a protective layer laminated on the shielding layer, the shielding film covering the substrate film such that the shielding layer is closer to the substrate film than the protective layer is; and a ground member arranged on the protective layer of the shielding film, the ground member including an external connection member having a first main surface and a second main surface opposite to the first main surface, and having electroconductivity, electroconductive (Continued)

particles disposed on the first main surface side, and an adhesive resin for fixing the electroconductive particles to the first main surface, wherein circularity of the cross sections of the electroconductive particles in the cross section of the ground member is 0.35 or more, and the electroconductive particles are penetrating the protective layer of the shielding film and connected to the shielding layer of the shielding film, and the external connection member of the ground member is electrically connectable to an external ground.

8 Claims, 6 Drawing Sheets

(56) References Cited

U.S. PATENT DOCUMENTS

2019/0261503 A1* 8/2019 Haruna .................... H01R 4/04
2019/0373716 A1* 12/2019 Haruna ................ H05K 1/0265

FOREIGN PATENT DOCUMENTS

| JP | 2012155950 A | 8/2012 |
| JP | 2012156457 A | 8/2012 |
| JP | 2017059802 A | 3/2017 |
| JP | 2020092279 A | 6/2020 |
| TW | 202025896 A | 7/2020 |

OTHER PUBLICATIONS

Written Opinion issued in International Application No. PCT/JP2021/034019, dated Nov. 9, 2021.

* cited by examiner

SHIELD PRINTED WIRING BOARD WITH GROUND MEMBER AND GROUND MEMBER

TECHNICAL FIELD

The present invention relates to a shielded printed wiring board with a ground member and the ground member.

BACKGROUND ART

Flexible printed wiring boards have been frequently used to incorporate circuits into complicated mechanisms in electronic equipment such as mobile phones, video cameras, and notebook computers, which are rapidly progressing in downsizing and increase in functionalization. Moreover, flexible printed wiring boards have also been used to connect movable parts such as printer heads to control units by making use of excellent flexibility thereof. This electronic equipment requires electromagnetic wave shielding measures. Among flexible printed wiring boards to be used in apparatuses, flexible printed wiring boards with electromagnetic wave shielding measures (hereinafter also described as "shielded printed wiring boards") have been increasingly used.

A common shielded printed wiring board is usually constituted of: a substrate film formed by sequentially stacking a base film, a printed circuit, and an insulating film; and a shielding film including an electroconductive layer, a shielding layer laminated on the electroconductive layer, and a protective layer laminated on the shielding layer, in which the substrate film is covered with the shielding film such that the electroconductive layer is in contact with the substrate film.

The printed circuit includes a ground circuit, and the ground circuit is electrically connected to the housing of electronic equipment for earthing.

As mentioned above, in the substrate film of the shielded printed wiring board, the insulating film is provided on the printed circuit including the ground circuit. The substrate film is covered with the shielding film having the protective layer.

Therefore, holes need to be made in portions of the insulating film and the shielding film beforehand to connect a ground circuit to a housing of the electronic equipment electrically.

When printed circuits were designed, this was a factor of a reduction in the degree of freedom.

Patent Literature 1 discloses a shielded flexible printed wiring board (shielded printed wiring board) in which at least one side of a substrate film formed by sequentially stacking a base film, a printed circuit, and an insulating film is covered with a shielding film, the shielding film is a film including a shielding layer including at least an electroconductive adhesive layer on one side of a cover film, the substrate film is covered with the electroconductive adhesive layer such that the electroconductive adhesive layer is bonded to the substrate film, and the shielded flexible printed wiring board (shielded printed wiring board) has a ground member formed such that a portion thereof is connected to the shielding layer of the shielding film, and another portion thereof is exposed, and is connectable to a ground portion adjacent thereto.

Furthermore, the invention according to the fourth embodiment of Patent Literature 1 discloses that the ground member has a metal foil, a plurality of metal fillers projected from one side of the metal foil, and an electroconductive adhesive layer that is between the metal foil and the metal fillers, and bonds the metal fillers to the metal foil, the electroconductive fillers are connected to the electroconductive adhesive layer and the metal thin layer of the shielding layer, and the metal foil is exposed and connected to a ground portion adjacent thereto.

In manufacturing the flexible printed wiring board described in Patent Literature 1, the ground member is pressed against the cover film such that the metal fillers of the ground member penetrate the cover film, and the ground member can be freely located at this time.

In such a flexible printed wiring board, a housing of electronic equipment can therefore be electrically connected to the ground circuit without reducing the degree of freedom for design.

CITATION LIST

Patent Literature

Patent Literature 1: JP 2003-86907 A

SUMMARY OF INVENTION

Technical Problem

On such a flexible printed wiring board on which a ground member is arranged, electric components are then arranged, and the flexible printed wiring board is subjected to reflow treatment for mounting electronic components.

In the flexible printed wiring board on which the ground member is arranged, the metal fillers of the ground member are in contact with the shielding layer of the shielding film. When the flexible printed wiring board is subjected to reflow treatment, each of members however expand and shrink thermally due to a thermal load, the metal fillers of the ground member and the shielding layer of the shielding film are displaced, and the contacts may decrease.

There has been a problem that when the contacts between the metal fillers of the ground member and the shielding layer of the shielding film decreased, the connection stability was deteriorated, and the electrical resistance between the ground member and the shielding layer increased.

The present invention is an invention that has been made to solve the above-mentioned problem, and an object of the present invention is to provide a shielded printed wiring board with a ground member in which even though a thermal load is applied, the connection stability between the electroconductive particles of the ground member and the shielding layer of a shielding film is hardly deteriorated.

Solution to Problem

A shielded printed wiring board with a ground member of the present invention is a shielded printed wiring board with a ground member, including: a substrate film formed by sequentially stacking a base film, a printed circuit including a ground circuit, and an insulating film; a shielding film including a shielding layer and a protective layer laminated on the shielding layer, the shielding film covering the substrate film such that the shielding layer is closer to the substrate film than the protective layer is; and a ground member arranged on the protective layer of the shielding film, the ground member including: an external connection member having a first main surface and a second main surface opposite to the first main surface, and having electroconductivity; electroconductive particles disposed on the first main surface side; and an adhesive resin for fixing the electroconductive particles to the first main surface, wherein circularity of the cross sections of the electroconductive particles in the cross section of the ground member is 0.35 or more, and the electroconductive particles are penetrating the protective layer of the shielding film and connected to the shielding layer of the shielding film, and the external connection member of the ground member is electrically connectable to an external ground.

In the shielded printed wiring board with the ground member of the present invention, the circularity of the cross sections of the electroconductive particles is 0.35 or more, and the circularity is high.

In the shielded printed wiring board with the ground member of the present invention, there are therefore many contacts between the electroconductive particles of the ground member and the shielding layer of and the shielding film, and the contact area thereof is large.

When the shielded printed wiring board with the ground member of the present invention is subjected to reflow treatment or a heat resistance test, the contacts between the electroconductive particles of the ground member and the shielding layer of the shielding film can therefore be maintained even in the case of the thermal expansion or shrinkage of members.

Therefore, the connection stability between the electroconductive particles of the ground member and the shielding layer of the shielding film is hardly deteriorated.

In the shielded printed wiring board with the ground member of the present invention, the average circle-equivalent diameter of the cross sections of the electroconductive particles is preferably twice or more the thickness of the protective layer of the shielding film.

If the average circle-equivalent diameter of the electroconductive particles is in the above-mentioned range, the electroconductive particles of the ground member can fully penetrate the protective layer of the shielding film, and the electroconductive particles of the ground member can be certainly contacted with the shielding layer of the shielding film.

The term "circle-equivalent diameter" used herein means a diameter wherein the area of the cross section of an electroconductive particle in the cross section of the ground member is converted into the area of a perfect circle, and the diameter is calculated from the area of the perfect circle.

In the shielded printed wiring board with the ground member of the present invention, the electroconductive particles preferably contain at least one selected from the group consisting of copper, silver, nickel, silver-coated copper, silver-coated nickel, tin-coated copper, and tin-coated nickel.

Since these materials have high electroconductivity, are easily processed, and easily increase the circularity of the electroconductive particles, these materials are suitable as the material of the electroconductive particles in the present invention.

In the shielded printed wiring board with the ground member of the present invention, the external connection member preferably contain at least one selected from the group consisting of copper, silver, gold, aluminum, nickel, chromium, titanium, zinc, and the stainless steel.

These materials are suitable materials to connect the ground member to the external ground electrically.

The ground member of the present invention is a ground member used for the above said shielded printed wiring board with a ground member, the ground member including: an external connection member having a first main surface and a second main surface opposite to the first main surface, and having electroconductivity; electroconductive particles disposed on the first main surface side; and an adhesive resin for fixing the electroconductive particles to the first main surface, wherein circularity of cross sections of the electroconductive particles in cross section of the ground member is 0.35 or more when the ground member is used for the shielded printed wiring board with a ground member.

The ground member of the present invention is a ground member used for the shielded printed wiring board with a ground member of the present invention. In the shielded printed wiring board with ground member, the circularity of the electroconductive particles in the cross section of the ground member is 0.35 or more.

In the shielded printed wiring board with the ground member using the ground member of the present invention, the contacts between the electroconductive particles of the ground member and the shielding layer of the shielding film can be increased, and the contact area thereof can be increased.

When the shielded printed wiring board with the ground member of the present invention is subjected to reflow treatment or a heat resistance test, the contacts between the electroconductive particles of the ground member and the shielding layer of the shielding film can therefore be maintained even in the case where the application of a thermal load to each of the members leads to the thermal expansion or shrinkage.

Accordingly, the connection stability between the electroconductive particles of the ground member and the shielding layer of the shielding film is hardly deteriorated.

The ground member of the present invention is a ground member including: an external connection member having a first main surface and a second main surface opposite to the first main surface, and having electroconductivity; electroconductive particles disposed on the first main surface side; and an adhesive resin for fixing the electroconductive particles to the first main surface, wherein circularity of the cross sections of the electroconductive particles in the cross section of the ground member after the compression bonding under the following compression bonding conditions is 0.35 or more.

Pressurization conditions: a resin layer is provided in which an uncured epoxy resin is applied so as to have a thickness of 10 μm onto a layer containing a cured epoxy resin and having a thickness of 6 μm. Then, the resin layer is arranged such that the layer containing the cured epoxy resin faces upward, and the ground member is arranged thereon such that the first main surface of the external connection member faces downward. Then, the ground member is compression bonded to the resin layer under the conditions of 3 MPa and 30 minutes.

The ground member of the present invention is arranged on a substrate film formed by sequentially stacking a base film, a printed circuit, and an insulating film, and a shielding film including an electroconductive layer, a shielding layer laminated on the electroconductive layer, and a protective layer laminated on the shielding layer, in which the substrate film is covered with the shielding film such that the electroconductive layer is in contact with the substrate film. Specifically, the ground member is thermocompression bonded such that the electroconductive particles of the ground member penetrate the protective layer of the shielding film, and is in contact with the electroconductive layer of the shielding film.

When the ground member of the present invention is used for the shielded printed wiring board, the contacts between the electroconductive particles of the ground member and the shielding layer of the shielding film can be increased, and the contact area thereof can be increased.

When the shielded printed wiring board using the ground member of the present invention is subjected to reflow treatment or a heat resistance test, the contacts between the electroconductive particles of the ground member and the shielding layer of the shielding film can therefore be maintained even in the case where the application of a thermal load to each of the members leads to the thermal expansion or shrinkage.

Accordingly, the connection stability between the electroconductive particles of the ground member and the shielding layer of the shielding film is hardly deteriorated.

In the ground member of the present invention, the peripheries of the electroconductive particles may be surrounded by the adhesive resin.

A mixture of the electroconductive particles and the adhesive resin can be merely applied to the first main surface of the external connection member to produce such a ground member easily.

In the ground member of the present invention, at least some of the electroconductive particles may be exposed from the adhesive resin.

When a portion of the electroconductive particles is exposed from the adhesive resin, the electrification is possible through these exposed portions. In manufacturing the shielded printed wiring boards using the ground member, the electroconductive particles of the ground member can therefore be electrically connected to the shielding layer of the shielding film easily.

Advantageous Effects of Invention

In the shielded printed wiring board with the ground member of the present invention, the circularity of the cross sections of the electroconductive particles is 0.35 or more, and the circularity is high.

In the shielded printed wiring board with the ground member of the present invention, there are therefore many contacts between the electroconductive particles of the ground member and the shielding layer of the shielding film, and the contact area thereof is large.

When the shielded printed wiring board with the ground member of the present invention is subjected to reflow treatment or a heat resistance test, the contacts between the electroconductive particles of the ground member and the shielding layer of the shielding film can therefore be maintained even in the case of the thermal expansion or shrinkage of members.

Therefore, the connection stability between the electroconductive particles of the ground member and the shielding layer of the shielding film is hardly deteriorated.

DESCRIPTION OF EMBODIMENTS

Hereinafter, a ground member and a shielded printed wiring board with the ground member of the present invention will be described specifically. However, the present invention is not limited to the following embodiments. As long as the gist of the present invention is not changed, the present invention can be appropriately modified and applied.

First, the ground member of the present invention will be described.

Figure 1:
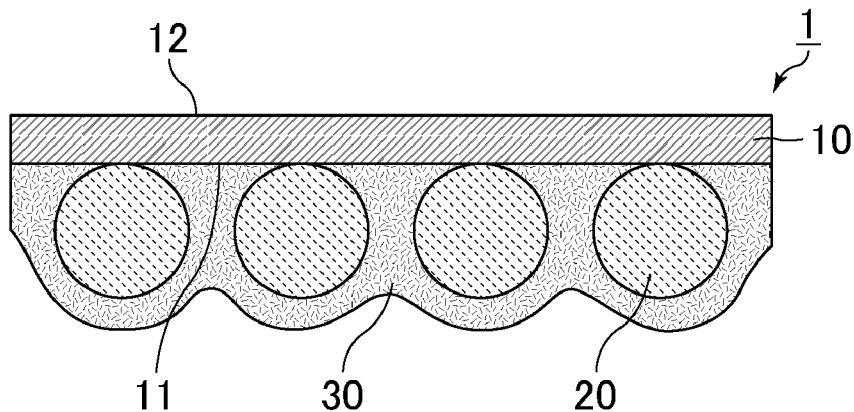
FIG. 1 is a cross-sectional view schematically showing an example of a ground member of the present invention.

FIG. 1 is a cross-sectional view schematically showing an example of the ground member of the present invention.

As shown in FIG. 1, a ground member 1 includes an external connection member 10 having a first main surface 11 and a second main surface 12 opposite to the first main surface 11, and having electroconductivity.

Electroconductive particles 20 is fixed to the first main surface 11 with an adhesive resin 30.

In the ground member 1, the peripheries of the electroconductive particles 20 are furthermore surrounded by the adhesive resin 30.

The ground member 1 is used for a shielded printed wiring board.

The configuration of such a shielded printed wiring board will be described using a drawing.

Figure 2:
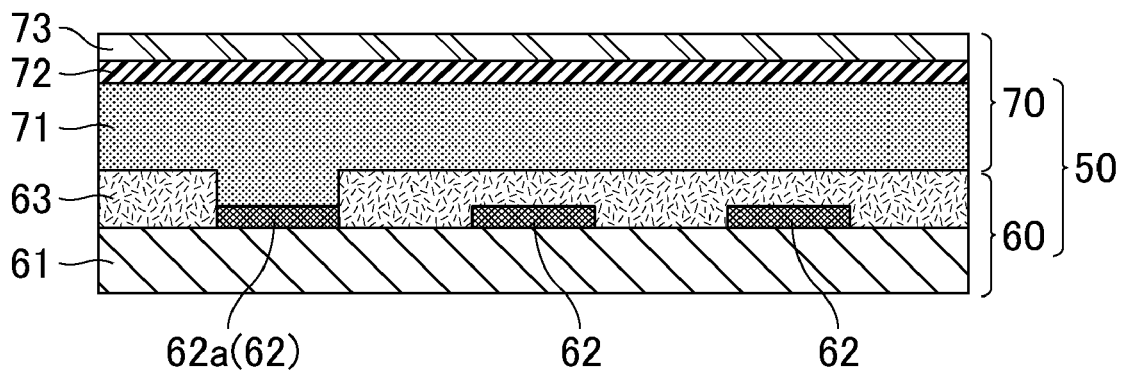
FIG. 2 is a cross-sectional view schematically showing an example of a shielded printed wiring board before a ground member of the present invention is arranged.

FIG. 2 is a cross-sectional view schematically showing an example of the shielded printed wiring board before the ground member of the present invention is arranged.

As shown in FIG. 2, a shielded printed wiring board 50 includes a substrate film 60 and a shielding film 70.

In the shielded printed wiring board 50, the substrate film 60 is a film formed by sequentially stacking a printed circuit 62 including a ground circuit 62a and an insulating film 63 on a base film 61.

The shielding film 70 is a film including an adhesive layer 71, a shielding layer 72 laminated on the adhesive layer 71, and a protective layer 73 laminated on the shielding layer 72.

In the shielded printed wiring board 50, the substrate film 60 is covered with the shielding film 70 such that the adhesive layer 71 of the shielding film 70 is contact with the substrate film 60.

Then, the case where the ground member 1 is used for the shielded printed wiring board 50 will be described using a drawing.

Figure 3:
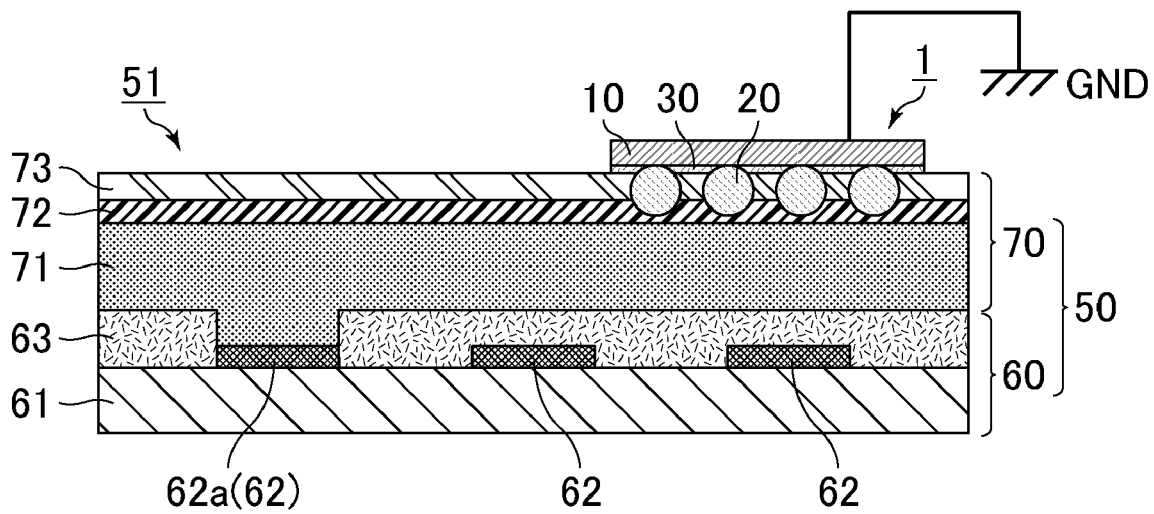
FIG. 3 is a cross-sectional view schematically showing an example of a shielded printed wiring board with a ground member of the present invention.

FIG. 3 is a cross-sectional view schematically showing an example of a shielded printed wiring board with a ground member of the present invention.

As shown in FIG. 3, in a shielded printed wiring board 51 with a ground member, a ground member 1 is arranged on a shielded printed wiring board 50.

In manufacturing the shielded printed wiring board 51 with the ground member, the ground member 1 is pressed against and arranged on the shielded printed wiring board 50 such that the electroconductive particles 20 of the ground member 1 penetrates the protective layer 73 of a shielding film 70.

It is preferable that conditions in pressing the ground member 1 against the shielded printed wiring board 50 be appropriately set depending on the size of the electroconductive particles 20 of the ground member 1 and the thickness and the type of the protective layer 73 of the shielding film 70.

For example, the conditions in pressing the ground member 1 against the shielded printed wiring board 50 is preferably 2 to 9 MPa and 3 to 60 minutes, more preferably 4 to 9 MPa and 30 to 60 minutes.

The electroconductive particles 20 of the ground member 1 are contacted with the shielding layer 72 of the shielding film 70.

When the external connection member 10 of the ground member 1 is connected to an external ground GND, the shielding layer 72 of the shielding film 70 is electrically connected to the external ground GND.

Since the ground member 1 is thus arranged on the shielded printed wiring board 50, a hole or the like does not need to be provided in the protective layer 73 of the shielding film 70 beforehand, and the ground member 1 can be arranged at any position.

The shielded printed wiring board 51 with the ground member is also an aspect of the shielded printed wiring board with the ground member of the present invention.

In the shielded printed wiring board 51 with the ground member, the circularity of the cross sections of electroconductive particles 20 in a cross section of ground member 1 is 0.35 or more. The circularity is preferably 0.39 or more, more preferably 0.4 or more, further preferably 0.5 or more, still further 0.6 or more, particularly preferably 0.8 or more. The upper limit of the circularity is preferably 1.0, and the upper limit is more preferably 0.98, further preferably 0.90, further preferably 0.85 from the viewpoint of production cost.

Since the circularity of cross sections of the electroconductive particles 20 in the cross section of the ground member 1 is 0.35 or more, there are many contacts between the electroconductive particles 20 of the ground member 1 and the shielding layer 72 of the shielding film 70 in the shielded printed wiring board 51 with the ground member, and the contact area thereof is large.

When the shielded printed wiring board 51 with the ground member is subjected to reflow treatment or a heat resistance test, the contacts between the electroconductive particles 20 of the ground member 1 and the shielding layer 72 of the shielding film 70 can therefore be maintained even in the case of the thermal expansion or shrinkage of members.

Therefore, the connection stability between the electroconductive particles 20 of the ground member 1 and the shielding layer 72 of the shielding film 70 is hardly deteriorated.

The phrase "circularity of the cross sections of the electroconductive particles in the cross section of the ground member" used herein means a value measured and calculated by the following method.

First, the shielded printed wiring board with the ground member is embedded in an epoxy resin.

Then, the ground member is cut with the epoxy resin, and the cross section of the ground member is photographed with a scanning electron microscope (SEM).

Next, 10 electroconductive particles appearing in the cross-sectional SEM image are selected at random using image analysis software (SEM Control User Interface Ver3.10). The circumferential length and the cross-sectional area of the electroconductive particles are measured to calculate the circularity based on the following expression.

$$\text{Circularity} = 4\pi \times (\text{area})/(\text{circumferential length})^2$$

Examples of the method for adjusting the circularity of the cross sections of the electroconductive particles 20 to 0.35 or more in the shielded printed wiring board 51 with the ground member include a method using electroconductive particles having high sphericity in manufacturing the ground member 1. Examples of the method for obtaining electroconductive particles having high sphericity include atomization and disk atomization.

The circularity of the cross sections of the electroconductive particles can be controlled by adjusting the press conditions in pressing the ground member 1 against the shielded printed wiring board 50.

In the ground member 1, the circularity of the cross sections of the electroconductive particles 20 in the cross section of the ground member 1 after compression bonding under the following compression bonding conditions is preferably 0.35 or more.

Pressurization conditions: A resin layer is provided in which an uncured epoxy resin is applied so as to have a thickness of 10 μm onto a layer containing a cured epoxy resin and having a thickness of 6 μm. Then, the resin layer is arranged such that the layer containing the cured epoxy resin faces upward, and the ground member is arranged thereon such that the first main surface of the external connection member faces downward. Then, the ground member is compression bonded to the resin layer under the conditions of 3 MPa and 30 minutes.

When, in the shielded printed wiring board 51 with the ground member, the thickness of the adhesive resin 30 is regarded as [A], the circle-equivalent diameter of the electroconductive particles 20 is regarded as [B], the thickness of the protective layer 73 is regarded as [C], and the total thickness of the shielding film 70 is regarded as [D], it is preferable that [C]<([B]−[A]), and 0.5≤([B]−[A])/[D]≤5.0.

If [C]<([B]−[A]), the electroconductive particles 20 easily penetrate the protective layer 73 of the shielding film 70, and the electroconductive particles 20 of the ground member 1 can be certainly contacted with the shielding layer 72 of the shielding film 70.

If ([B]−[A])/[D] is 0.5 or more, the connection stability between the ground member 1 and the shielding film 70 is improved.

If ([B]−[A])/[D] is 5.0 or less, the electroconductive particles 20 have moderate sizes, unevenness is hardly formed on the top surface of shielded printed wiring board 51 with the ground member, and the smoothness can be maintained. Consequently, a bonding film or the like is easily pasted on the shielded printed wiring board 51 with the ground member.

([B]−[A])/[D] is more preferably 0.8 or more, more preferably 1.0 or more.

The lower limit of ([B]−[A])/[D] is more preferably 4.5 or less, more preferably 4.0 or less.

[B]/[C] is preferably 3.0 or more, and preferably 7.0 or less.

If [B]/[C] is in the above-mentioned range, even repeated application of thermal shock to the shielded printed wiring board 51 with the ground member hardly increases the electrical resistance between the external connection member 10 of the ground member 1 and the shielding layer 72 of the shielding film 70.

Then, the configurations of the ground member 1 is described in detail.

In the ground member 1, the external connection member is preferably containing at least one selected from the group consisting of copper, silver, gold, aluminum, nickel, chromium, titanium, zinc, and stainless steel.

These materials are suitable materials for connecting the ground member to the external ground electrically.

In the ground member 1, the thickness of the external connection member 10 is not be limited, but is preferably 5 to 10 µm.

In the ground member 1, the average particle size of the electroconductive particles 20 is preferably 2 to 20 µm.

If the average particle size of the electroconductive particles 20 is in the above-mentioned range, in manufacturing the shielded printed wiring board 50 using the ground member 1, the electroconductive particles 20 of the ground member 1 can fully penetrate the protective layer 73 of the shielding film 70, and the electroconductive particles 20 of the ground member 1 can be certainly contacted with the shielding layer 72 of the shielding film 70.

In the ground member 1, the electroconductive particles 20 are preferably containing of at least one selected from the group consisting of copper, silver, nickel, silver-coated copper, silver-coated nickel, tin-coated copper, and tin-coated nickel.

Since these materials have high electroconductivity, and are easily processed, and the circularity of the electroconductive particles 20 is easily increased, these materials are suitable as the material of the electroconductive particles 20.

In the ground member 1, the electroconductive particles 20 are preferably particles produced by disk atomization.

The conductive particles 20 that are almost true spheres can be produced using disk atomization. When the shielded printed wiring board 50 is manufactured using the ground member 1 having such electroconductive particles, the contact area between the electroconductive particles 20 of the ground member 1 and the shielding layer 72 of the shielding film 70 can therefore be further increased. Consequently, the connection stability between the electroconductive particles 20 of the ground member 1 and the shielding layer 72 of the shielding film 70 is further hardly deteriorated.

The disk atomization is a method involving letting a molten metal flow down to a disk rotating at high speed and scattering a molten film formed on the disk upper surface in a droplet form by high-speed rotation to produce metal particles.

In this method, the regulation of the melting temperature and the number of disk revolutions enables producing spherical particles having a uniform particle size, high fluidity, and high arrangement.

In the ground member 1, the adhesive resin 30 is not limited, but is preferably containing an acryl-based resin, an epoxy-based resin, a silicone-based resin, a thermoplastic elastomer-based resin, a rubber-based resin, a polyester-based resin, a urethane-based resin, or the like. These resins have excellent adhesiveness.

As mentioned above, the peripheries of the electroconductive particles 20 are surrounded by the adhesive resin 30 in the ground member 1. Therefore, the ground member 1 can be easily manufactured only by applying a mixture of the electroconductive particles 20 and the adhesive resin 30 to the first main surface 11 of the external connection member 10.

The thickness when this mixture is applied is preferably 10 to 50 µm.

In the ground member of the present invention, at least a portion of the electroconductive particles may be exposed from the adhesive resin.

Figure 4:
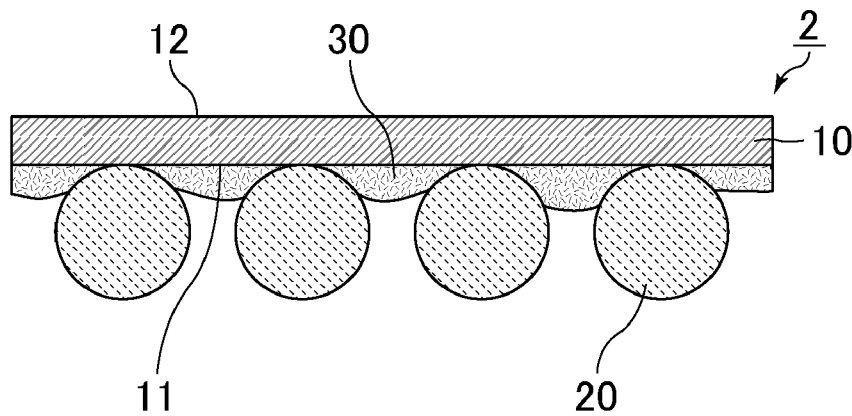
FIG. 4 is a cross-sectional view schematically showing another example of the ground member of the present invention.

FIG. 4 is a cross-sectional view schematically showing another example of the ground member of the present invention.

A ground member 2 shown in FIG. 4 has the same configuration as the ground member 1 shown in FIG. 1 except that a portion of the electroconductive particles 20 is exposed from the adhesive resin 30.

If a portion of the electroconductive particles 20 is exposed from the adhesive resin 30, electrification is possible through these exposed portions. In manufacturing the shielded printed wiring boards using the ground member 2, the electroconductive particles 20 of the ground member 2 can therefore be electrically connected to the shielding layer 72 of the shielding film 70 easily.

Then, the configurations of the shielded printed wiring board 50 will be described in detail.

The materials of the base film 61 and the insulating film 63 constituting the substrate film 60 of the shielded printed wiring board 50 are not limited, but are preferably made of engineering plastics.

Examples of such engineering plastics include resins such as polyethylene terephthalate, polypropylene, crosslinked polyethylene, polyesters, polybenzimidazole, polyimides, polyimide amides, polyetherimides, and polyphenylene sulfide.

If flame retardance is required, among these engineering plastics, a polyphenylene sulfide film is preferable. If heat resistance is required, a polyimide film is preferable. The thickness of the base film 61 is preferably 10 to 40 µm. The thickness of the insulating film 63 is preferably 10 to 30 µm.

The adhesive layer 71 constituting the shielding film 70 of the shielded printed wiring board 50 may be an electroconductive adhesive layer or an insulating adhesive layer.

If the adhesive layer 71 of the shielding film 70 is an electroconductive adhesive layer, the ground circuit 62*a*—the external ground GND can be electrically connected by contacting the ground circuit 62*a* with the adhesive layer 71.

When the configuration is such a configuration, the electromagnetic wave shielding properties are improved.

If the adhesive layer 71 is an electroconductive adhesive layer, the adhesive layer 71 may be an anisotropically electroconductive adhesive layer or an isotropically electroconductive adhesive layer.

If the adhesive layer 71 of the shielding film 70 is an insulating adhesive layer, the adhesive layer 71 of the shielding film 70 is not limited, but is preferably an acryl-based resin, an epoxy-based resin, a silicone-based resin, a thermoplastic elastomer-based resin, a rubber-based resin, a polyester-based resin, a urethane-based resin, or the like. The adhesive layer 71 of the shielding film 70 may contain a tackifier such as a fatty acid hydrocarbon resin, a C5/C9 mixed resin, rosin, a rosin derivative, a terpene resin, an aromatic hydrocarbon resin, or a thermally reactive resin. If these tackifiers are contained, the adhesiveness of the adhesive layer 71 of the shielding film 70 can be improved.

If the adhesive layer 71 of the shielding film 70 is an electroconductive adhesive layer, the adhesive layer 71 of the shielding film 70 includes a resin and electroconductive particulates.

The resin is not limited, but is preferably an acryl-based resin, an epoxy-based resin, a silicone-based resin, a thermoplastic elastomer-based resin, a rubber-based resin, a polyester-based resin, a urethane-based resin, or the like.

The adhesive layer 71 may contain a tackifier such as a fatty acid hydrocarbon resin, a C5/C9 mixed resin, rosin, a rosin derivative, a terpene resin, an aromatic hydrocarbon resin, or a thermally reactive resin. If these tackifiers are contained, the adhesiveness of the adhesive layer 71 can be improved.

Examples of the electroconductive particulate include, but are not limited to, copper powder, silver powder, nickel powder, silver-coated copper powder (Ag-coated Cu powder), gold-coated copper powder, silver-coated nickel powder (Ag-coated Ni powder), and gold-coated nickel powder. These metal powders can be produced by atomization, the carbonyl method, or the like. Besides the above, particles in which metal powder is covered with a resin or particles in which a resin is covered with metal powder can also be used. The electroconductive particulates are preferably Ag-coated Cu powder or Ag-coated Ni powder. This is because electroconductive particulates having stable electroconductivity can be obtained with low-priced materials.

The shape of the electroconductive particulates does not need to be limited to a spherical form, and may be, for example, a branched form, a flake form, a spike form, a bar form, a fibrous form, a needle form, or the like.

If the adhesive layer 71 of the shielding film 70 is an electroconductive adhesive layer, the adhesive layer 71 may be an anisotropically electroconductive adhesive layer or an isotropically electroconductive adhesive layer, but the adhesive layer 71 is more preferably an anisotropically electroconductive adhesive layer.

If the adhesive layer 71 is an anisotropically electroconductive adhesive layer, the electroconductive particulates are preferably contained in the range of 3 to 39% by weight with respect to the total amount of the adhesive layer 71. The average particle size of the electroconductive particulates is preferably in the range of 2 to 20 μm, but the most suitable size is preferably selected depending on the thickness of the anisotropically electroconductive adhesive layer.

If the adhesive layer 71 is an isotropically electroconductive adhesive layer, the electroconductive particulates are preferably contained in the range of more than 39% by weight and 95% by weight or less with respect to the total amount of the adhesive layer 71. The average particle size of the electroconductive particulates can be selected in the same way as in the anisotropically electroconductive adhesive layer.

As long as the shielding effect of covering the board from noise such as unnecessary radiation from electric signals or electromagnetic waves from the outside is exhibited, the shielding layer 72 constituting the shielding film 70 of the shielded printed wiring board 50 may be made of any material. For example, the shielding layer 72 may be made of an isotropically electroconductive resin or a metal.

If the shielding layer 72 of the shielding film 70 is made of a metal, the shielding layer 72 may be a metal layer such as a metal foil or a vapor-deposited film, or may be an aggregate of the electroconductive particles formed in a layer form.

If the shielding layer 72 of the shielding film 70 is a metal layer, a material constituting the metal preferably contains at least one selected from the group consisting of nickel, copper, silver, gold, palladium, aluminum, chromium, titanium, zinc, and an alloy thereof.

If the shielding layer 72 of the shielding film 70 is the aggregate of the electroconductive particulates, the electroconductive particulates are preferably containing copper powder, silver powder, nickel powder, silver-coated copper powder (Ag-coated Cu powder), gold-coated copper powder, silver-coated nickel powder (Ag-coated Ni powder), or gold-coated nickel powder.

The shielding layer 72 of the shielding film 70 containing these materials has high electroconductivity, and exhibits the shielding effect of covering the board from noise such as unnecessary radiation from electric signals or electromagnetic waves from the outside.

The thickness of the shielding layer 72 of the shielding film 70 is preferably 0.01 to 10 μm.

If the thickness of the shielding layer of the shielding film is less than 0.01 μm, enough shielding effect is hardly obtained, and the shielding layer is easily torn in receiving physical shock and thermal shock.

If the thickness of the shielding layer of the shielding film exceeds 10 μm, the shielding layer is hardly flexed.

The material of the protective layer 73 constituting the shielding film 70 of the shielded printed wiring board 50 is not limited, but is preferably an epoxy-based resin, a polyester-based resin, an acryl-based resin, a phenol-based resin, a urethane-based resin, or the like.

The thickness of the protective layer 73 of the shielding film 70 is preferably 1 to 10 μm.

If the thickness of the protective layer is less than 1 μm, the protective layer is easily torn, and hardly has enough insulating properties.

If the thickness of the protective layer exceeds 10 μm, the electroconductive particles of the ground member hardly penetrates the protective layer.

Then, another aspect of the shielded printed wiring board with the ground member of the present invention is described.

Figure 5:
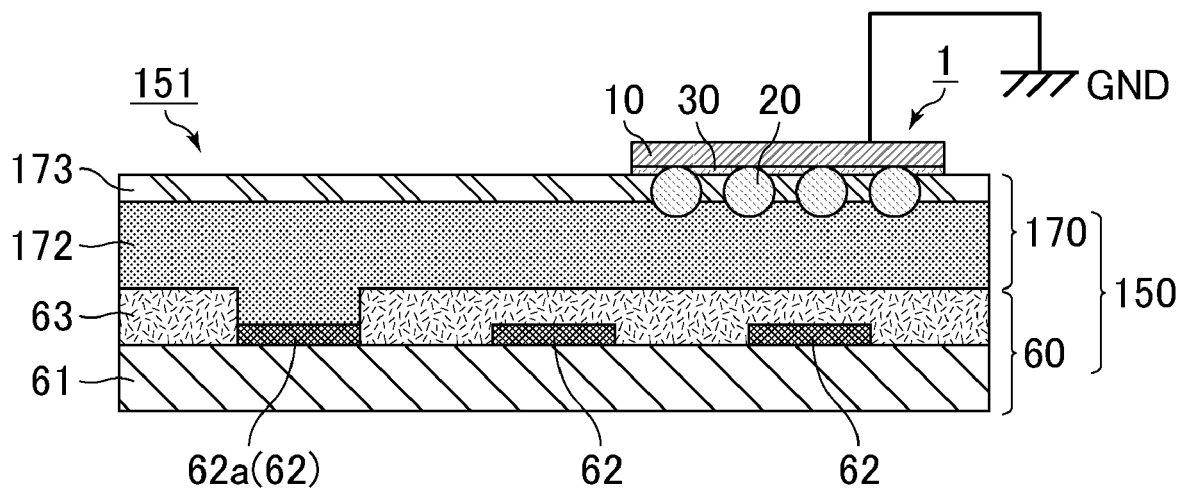
FIG. 5 is a cross-sectional view schematically showing another example of the shielded printed wiring board with the ground member of the present invention.

FIG. 5 is a cross-sectional view schematically showing another example of the shielded printed wiring board with the ground member of the present invention.

A shielded printed wiring board 151 with a ground member shown in FIG. 5 has the same configuration as the shielded printed wiring board 51 with ground member shown in FIG. 3 except that a shielding film 170 includes a protective layer 173 and a shielding layer 172, the shielding layer 172 is an electroconductive adhesive layer, and the shielding layer 172 is formed by integrating the shielding layer 72 and the adhesive layer 71.

In the shielded printed wiring board 151 with the ground member, the shielding layer 172 is an electroconductive adhesive layer, and has both a function for bonding the shielding film 170 to the substrate film 60 and a function of shielding the board from electromagnetic waves.

The shielding layer 172 of the shielding film 170 is an electroconductive adhesive layer containing a resin and electroconductive particulates.

The resin constituting the shielding layer 172 is not limited, but is preferably an acryl-based resin, an epoxy-based resin, a silicone-based resin, a thermoplastic elastomer-based resin, a rubber-based resin, a polyester-based resin, a urethane-based resin, or the like.

The shielding layer 172 may contain a tackifier such as a fatty acid hydrocarbon resin, a C5/C9 mixed resin, rosin, a rosin derivative, a terpene resin, an aromatic hydrocarbon resin, or a thermally reactive resin. If these tackifiers are contained, the adhesiveness of the shielding layer 172 can be improved.

Examples of the electroconductive particulates constituting the shielding layer 172 include, but are not limited to, copper powder, silver powder, nickel powder, silver-coated copper powder (Ag-coated Cu powder), gold-coated copper powder, silver-coated nickel powder (Ag-coated Ni powder), gold-coated nickel powder. These metal powders can be produced by atomization, the carbonyl method, or the like. Besides the above, particles in which metal powder is covered with a resin or particles in which a resin is covered with metal powder can also be used. The electroconductive particulates is preferably Ag-coated Cu powder or Ag-coated Ni powder. This is because electroconductive particulates having stable electroconductivity can be obtained with low-priced materials.

The shape of the electroconductive particulates do not need to be limited to a spherical form, and may be, for example, a branched form, a flake form, a spike form, a bar form, a fibrous form, a needle form, or the like.

Furthermore, the shielding layer 172 of the shielding film 170 is preferably an isotropically electroconductive adhesive layer. In this case, the electroconductive particulates are preferably contained in the range of more than 39% by weight and 95% by weight or less with respect to the total amount of the shielding layer. The average particle size of the electroconductive particulates is preferably 2 to 20 µm.

EXAMPLES

Hereinafter, Examples for describing the present invention more specifically will be shown, but the present invention is not limited to these Examples.

Manufacturing Example 1

Electroconductive particles made of copper-coated nickel and produced by atomization and an epoxy-based adhesive resin were mixed to produce an electroconductive particle-adhesive resin mixture.

Then, an external connection member having a thickness of 6 µm and made of copper was provided. The electroconductive particle-adhesive resin mixture was applied to one side, and then heated and dried to form an adhesive resin having a thickness of 10 µm. A ground member according to Manufacturing Example 1 was manufactured.

Manufacturing Example 2 to Manufacturing Example 3 and Comparative Manufacturing Example 1

Ground members according to Manufacturing Example 2 to Manufacturing Example 3 and Comparative Manufacturing Example 1 were manufactured in the same way as in Manufacturing Example 1 except that electroconductive particles shown in Table 1 were used.

TABLE 1

| | | Manufacturing Example 1 | Manufacturing Example 2 | Manufacturing Example 3 | Comparative Manufacturing Example 1 |
|---|---|---|---|---|---|
| Electro-conductive particle | Material | Silver-coated nickel | Tin-coated copper | Silver-coated copper | Silver-coated copper |
| | Production method | Atomization | Disk atomization | Atomization | Dendrite method |

(Manufacturing of Model Shielded Printed Wiring Board)

A shielding film 1 in which a shielding layer of 0.1 µm made of a vaper-deposited silver film and an anisotropically electroconductive adhesive layer of 10 µm were laminated on a protective layer of 6 µm made of an epoxy resin sequentially was provided.

A shielding film 2 in which a shielding layer of 2 µm made of copper foil and an anisotropically electroconductive adhesive layer of 10 µm were laminated on a protective layer of 6 µm made of an epoxy resin sequentially was provided.

A shielding film 3 in which a shielding layer of 14 µm made of an isotropically electroconductive resin was laminated on a protective layer of 6 µm made of an epoxy resin sequentially was provided. In the shielding film 3, the isotropically electroconductive resin also has a function as an adhesive layer.

Model boards made of a polyimide film and having a thickness of 63 µm were provided. The shielding films 1 was arranged on each of the model boards such that the adhesive layer is in contact with each of the model boards. The ground member according to Manufacturing Example 1 was arranged on the shielding film 1 such that the surface of the external connection member on which the electroconductive particles were disposed was opposed to the protective layer of the shielding film.

Then, the shielding film 1 and the ground member according to Manufacturing Example 1 were thermocompression bonded to the model board under the conditions of 3 MPa and 30 minutes.

This allows the electroconductive particles of the ground member according to Manufacturing Example 1 to penetrate the protective layer of the shielding film 1, and contacts the electroconductive particles of the ground member according to Manufacturing Example 1 with the shielding layer of the shielding film.

A model shielded printed wiring board according to Example 1 was thus manufactured.

Model shielded printed wiring boards according to Example 2 to Example 9 and Comparative Example 1 to Comparative Example 3 were manufactured in the same way as in Example 1 except that ground members and shielding films shown in Table 2 were used in combination.

(Measurement of Circularity)

Each model shielded printed wiring board was embedded in an epoxy resin.

Then, the ground member was cut with the epoxy resin using the microtome RM2265 manufactured by Leica Camera AG.

Next, the above-mentioned cross section was photographed through the scanning electron microscope JSM-6510LA manufactured by JEOL Ltd. The scan conditions were an secondary electron image, 1000 times or 3000 times, and acceleration voltage 15 kV.

Subsequently, 10 electroconductive particles appearing in the cross-sectional SEM image were selected at random to measure the circumferential lengths and cross-sectional areas of the cross sections of the electroconductive particles, and the circularities were measured based on the following expression to calculate the average value thereof using image analysis software (SEM Control User Interface Ver3.10). Table 2 shows the results.

$$\text{Circularity} = 4\pi \times (\text{area})/(\text{circumferential length})^2$$

The thickness of the adhesive resin in the ground member was also measured. Table 2 shows the results.

Figure 8:
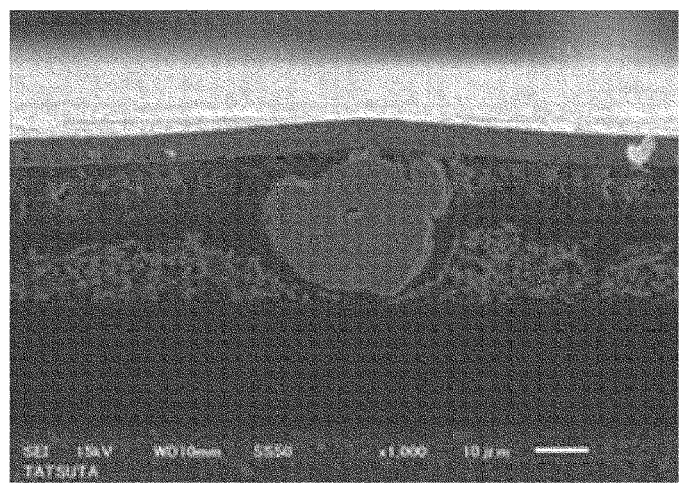
FIG. 8 is a SEM photograph of a cross section of a model shielded printed wiring board according to Example 3.

FIG. 8 is the SEM photograph of the cross section of the model shielded printed wiring board according to Example 3.

Figure 9:
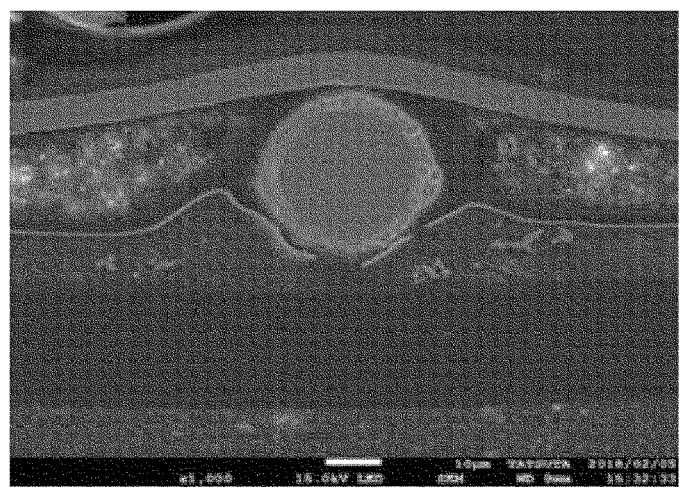
FIG. 9 is a SEM photograph of a cross section of a model shielded printed wiring board according to Example 4.

FIG. 9 is the SEM photograph of the cross section of the model shielded printed wiring board according to Example 4.

Figure 10:
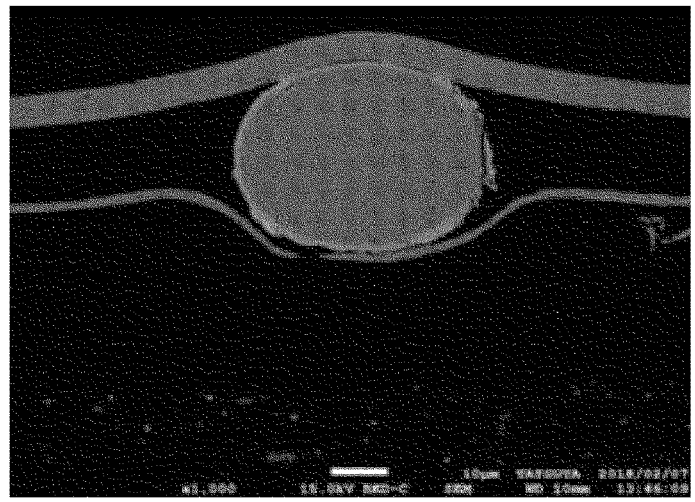
FIG. 10 is a SEM photograph of a cross section of a model shielded printed wiring board according to Example 5.

FIG. 10 is the SEM photograph of the cross section of the model shielded printed wiring board according to Example 5.

Figure 11:
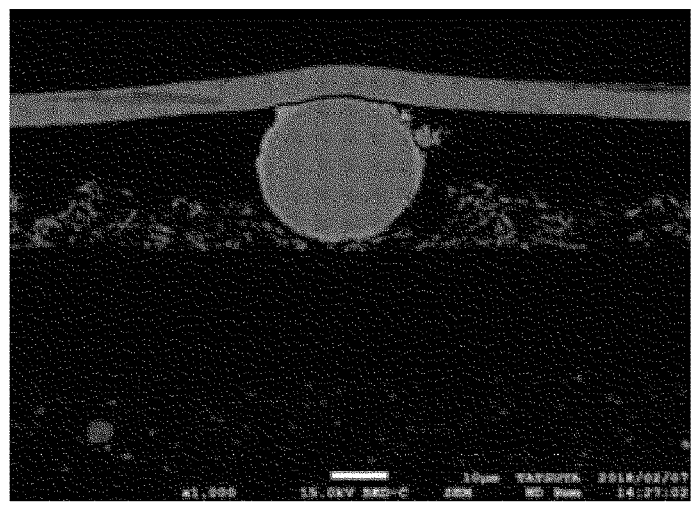
FIG. 11 is a SEM photograph of a cross section of a model shielded printed wiring board according to Example 6.

FIG. 11 is the SEM photograph of the cross section of the model shielded printed wiring board according to Example 6.

Figure 12:
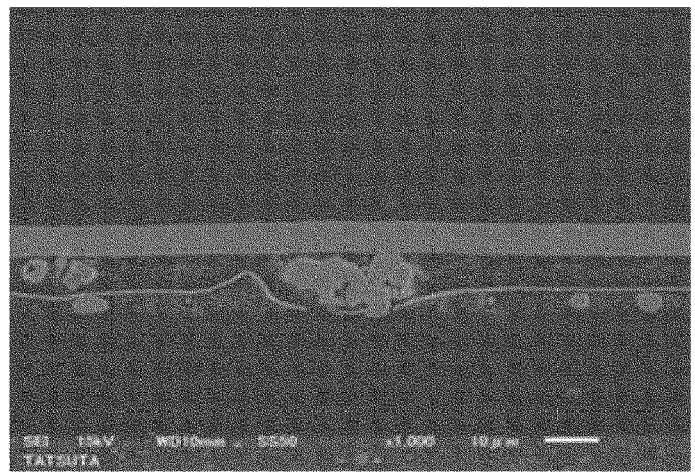
FIG. 12 is a SEM photograph of a cross section of a model shielded printed wiring board according to Example 7.

FIG. 12 is the SEM photograph of the cross section of the model shielded printed wiring board according to Example 7.

Figure 13:
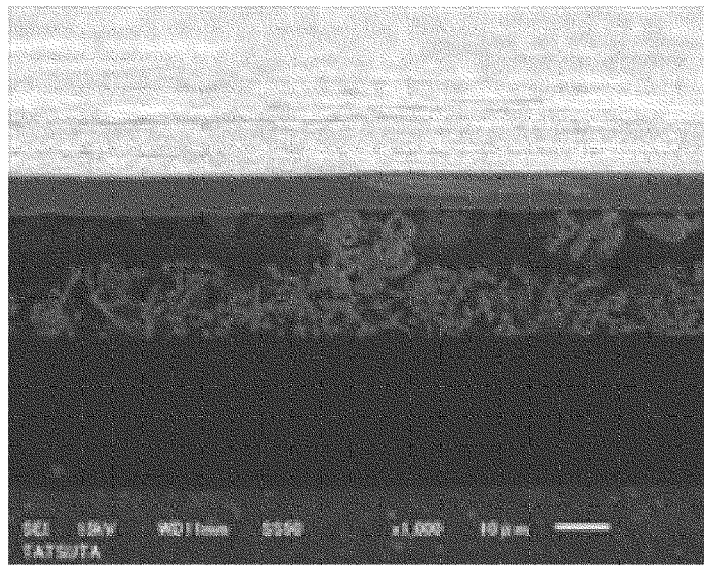
FIG. 13 is a SEM photograph of a cross section of a model shielded printed wiring board according to Example 8.

FIG. 13 is the SEM photograph of the cross section of the model shielded printed wiring board according to Example 8.

Figure 14:
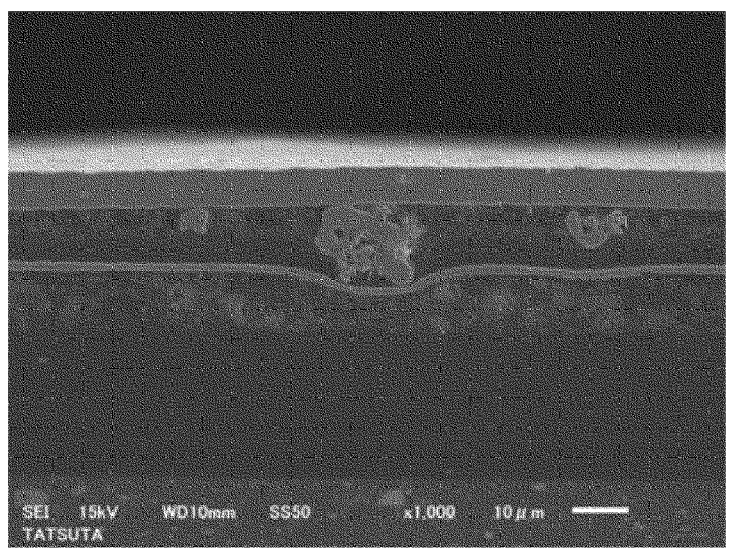
FIG. 14 is a SEM photograph of a cross section of a model shielded printed wiring board according to Example 9.

FIG. 14 is the SEM photograph of the cross section of the model shielded printed wiring board according to Example 9.

Figure 15:
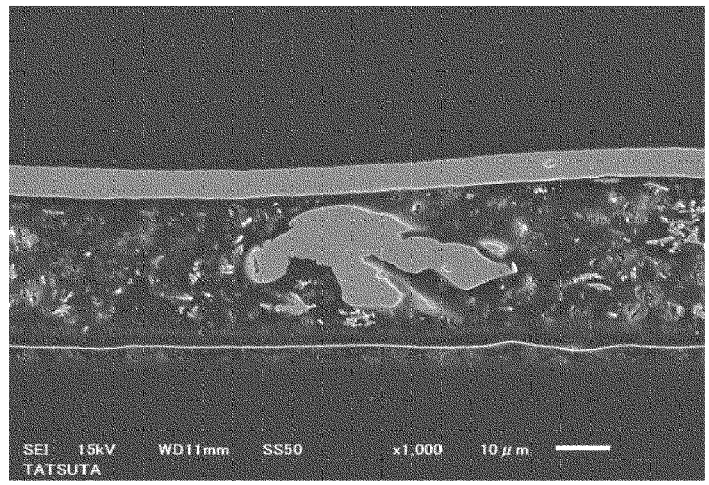
FIG. 15 is a SEM photograph of a cross section of a model shielded printed wiring board according to Comparative Example 1.

FIG. 15 is the SEM photograph of the cross section of the model shielded printed wiring board according to Comparative Example 1.

TABLE 2

| | Ex. 1 | Ex. 2 | Ex. 3 | Ex. 4 | Ex. 5 | Ex. 6 | Ex. 7 | Ex 8 | Ex. 9 | Comp. Ex. 1 | Comp. Ex. 2 | Comp. Ex. 3 |
|---|---|---|---|---|---|---|---|---|---|---|---|---|
| Ground member | Mfg. Ex. 1 | Mfg. Ex. 1 | Mfg. Ex. 1 | Mfg. Ex. 2 | Mfg. Ex. 2 | Mfg. Ex. 2 | Mfg. Ex. 3 | Mfg. Ex. 3 | Mfg. Ex. 3 | Comp. Mfg. Ex. 1 | Comp. Mfg. Ex. 1 | Comp. Mfg. Ex. 1 |
| Thickness of adhesive resin [A] (μm) | 10 | 10 | 10 | 12 | 12 | 12 | 5 | 5 | 5 | 25 | 25 | 25 |
| Cross-sectional area of electroconductive particles (μm) | 317.8 | 601.7 | 714.0 | 762.6 | 1258.5 | 608.2 | 190.6 | 183.0 | 190.2 | 852.0 | 542.8 | 1155.0 |
| Circumferential length of electroconductive particles (μm) | 77.4 | 99.7 | 120.6 | 112.3 | 138.0 | 97.4 | 74.4 | 77.1 | 81.6 | 293.0 | 199.3 | 256.8 |
| Circularity of electroconductive particles | 0.67 | 0.76 | 0.62 | 0.76 | 0.83 | 0.81 | 0.43 | 0.39 | 0.36 | 0.13 | 0.17 | 0.22 |
| Circle-equivalent diameter of electroconductive particles [B] (μm) | 20.1 | 27.7 | 30.2 | 31.2 | 40.0 | 27.8 | 15.6 | 15.3 | 15.6 | 32.9 | 26.3 | 38.35 |
| Circle-equivalent diameter of electroconductive particles − thickness of adhesive resin ([B] − [A]) | 10.1 | 17.7 | 20.2 | 19.2 | 28.0 | 15.8 | 10.6 | 10.3 | 10.6 | 7.9 | 1.3 | 13.3 |
| Shielding film | Shielding film 1 | Shielding film 2 | Shielding film 3 | Shielding film 1 | Shielding film 2 | Shielding film 3 | Shielding film 1 | Shielding film 2 | Shielding film 3 | Shielding film 1 | Shielding film 2 | Shielding film 3 |
| Thickness of protective layer [C] (μm) | 6 | 6 | 6 | 6 | 6 | 6 | 6 | 6 | 6 | 6 | 6 | 6 |
| Total thickness of shielding film [D] (μm) | 15 | 17 | 16 | 15 | 17 | 16 | 15 | 15 | 17 | 15 | 17 | 16 |
| [B]/[C] | 3.35 | 4.61 | 5.03 | 5.19 | 6.67 | 4.64 | 2.60 | 2.54 | 2.59 | 5.49 | 4.38 | 6.39 |
| ([B] − [A])/[D] | 0.67 | 1.04 | 1.26 | 1.28 | 1.65 | 0.99 | 0.71 | 0.68 | 0.62 | 0.53 | 0.08 | 0.83 |
| Heat resistance test 1 (Ω) | 0.613 | 0.032 | 0.761 | 0.419 | 0.007 | 0.122 | 0.816 | 0.014 | 0.757 | 1000 or more | 1000 or more | 4.861 |
| Heat resistance test 2 (Ω) | 1.189 | 0.181 | 5.586 | 1.303 | 0.008 | 0.486 | 4.721 | 5.934 | 100 or more | 1000 or more | 1000 or more | 1000 or more |

FIGS. 6 to 17 show SEM photographs of cross sections of the ground members according to Example 1 to Example 9 and Comparative Example 1 to Comparative Example 3.

Figure 6:
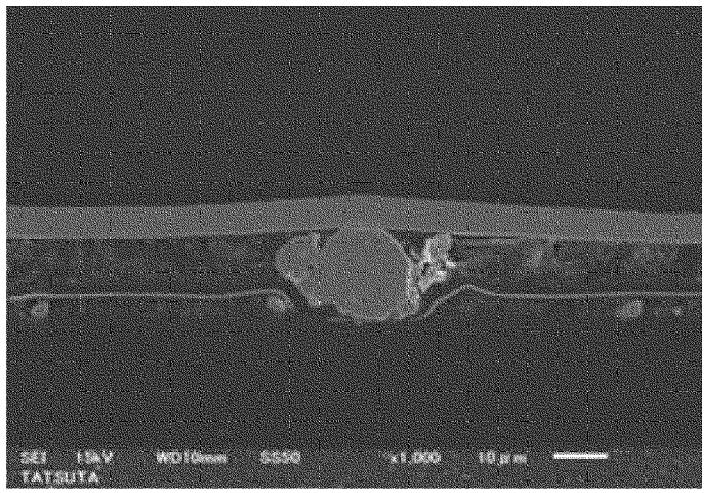
FIG. 6 is a SEM photograph of a cross section of a model shielded printed wiring board according to Example 1.

FIG. 6 is the SEM photograph of the cross section of the model shielded printed wiring board according to Example 1.

Figure 7:
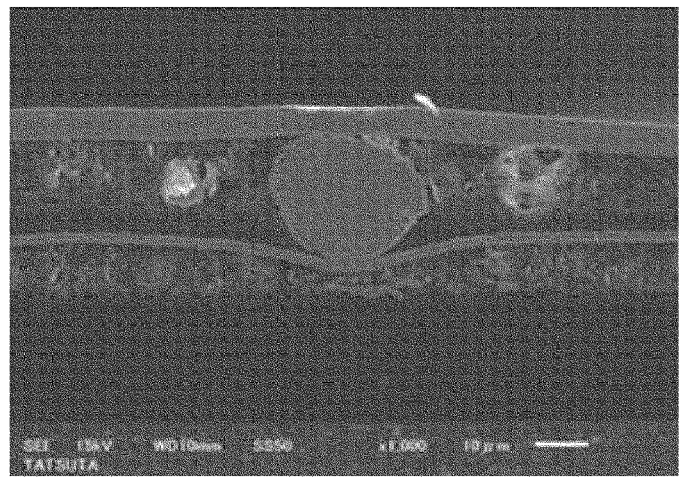
FIG. 7 is a SEM photograph of a cross section of a model shielded printed wiring board according to Example 2.

FIG. 7 is the SEM photograph of the cross section of the model shielded printed wiring board according to Example 2.

Figure 16:
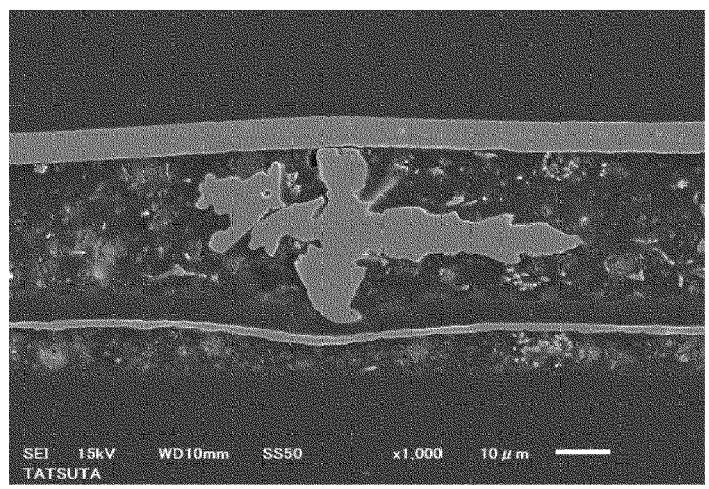
FIG. 16 is a SEM photograph of a cross section of a model shielded printed wiring board according to Comparative Example 2.

FIG. 16 is the SEM photograph of the cross section of the model shielded printed wiring board according to Comparative Example 2.

Figure 17:
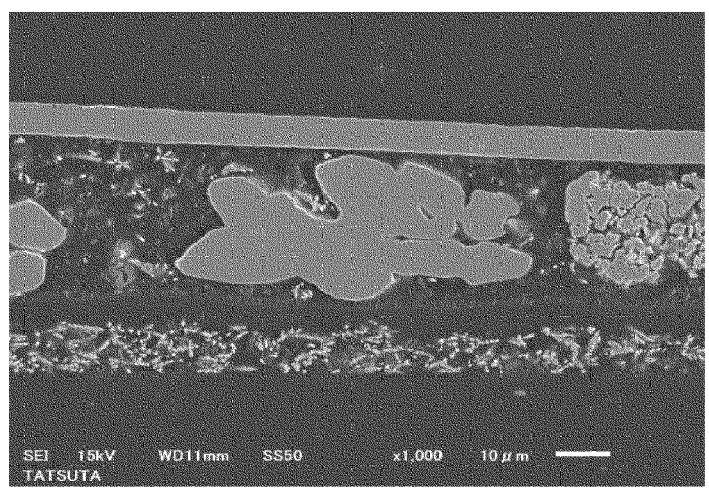
FIG. 17 is a SEM photograph of a cross section of a model shielded printed wiring board according to Comparative Example 3.

FIG. 17 is the SEM photograph of the cross section of the model shielded printed wiring board according to Comparative Example 3.

(Heat Resistance Test 1)

A process involving disposing each of the model shielded printed wiring boards in a furnace, heating the model shielded printed wiring boards to an atmosphere temperature of 260° C., and then leaving the model shielded printed wiring boards to stand to room temperature was repeated three times to apply thermal shock to the model shielded printed wiring boards.

Then, the electrical resistance between the external connection member of the ground member and the shielding layer of the shielding film of each of the model shielded printed wiring boards was measured. Table 2 shows the results.

(Heat Resistance Test 2)

A process involving disposing each of the model shielded printed wiring boards in a furnace, cooling the model shielded printed wiring boards to an atmosphere temperature of −55° C., then heating the model shielded printed wiring boards to 125° C., and maintaining the temperature for 15 minutes was repeated 200 times to apply thermal shock to the model shielded printed wiring boards.

Then, the electrical resistance between the external connection member of the ground member and the shielding layer of the shielding film of each of the model shielded printed wiring boards was measured. Table 2 shows the results.

As shown in Table 2, it was proved that if the ground members according to Example 1 to Example 9, in which the circularities of the electroconductive particles of the ground members were 0.35 or more, were used in the model shielded printed wiring boards, the electrical resistance between the external connection member of the ground member and the shielding layer of the shielding film of each of the model shielded printed wiring boards decreased, and the connection stability was maintained in the heat resistance test 1.

It was proved that, in Examples 1 to 8, in which the circularities of the electroconductive particles of the ground members were 0.39 or more, the electrical resistance between the external connection member of the ground member and the shielding layer of the shielding film of each of the model shielded printed wiring boards decreased, and the connection stability was maintained also in the heat resistance test 2.

REFERENCE SIGNS LIST 1, 2: Ground member
10: External connection member
20: Electroconductive particle
30: Adhesive resin
50: Shielded printed wiring board
51, 151: Shielded printed wiring board with ground member
60: Substrate film
61: Base film
62: Printed circuit
62a: Ground circuit
63: Insulating film
70, 170: Shielding film
71: Adhesive layer
72, 172: Shielding layer
73, 173: Protective layer

The invention claimed is:

1. A shielded printed wiring board with a ground member, comprising:
a substrate film formed by sequentially stacking a base film, a printed circuit including a ground circuit, and an insulating film;
a shielding film including a shielding layer and a protective layer laminated on the shielding layer, the shielding film covering the substrate film such that the shielding layer is closer to the substrate film than the protective layer is; and
a ground member arranged on the protective layer of the shielding film, the ground member including
an external connection member having a first main surface and a second main surface opposite to the first main surface, and having electroconductivity;
electroconductive particles disposed on the first main surface side; and
an adhesive resin for fixing the electroconductive particles to the first main surface,
wherein circularity of cross sections of the electroconductive particles in a cross section of the ground member is 0.35 or more, and the electroconductive particles are penetrating the protective layer of the shielding film and connected to the shielding layer of the shielding film, and
the external connection member of the ground member is electrically connectable to an external ground.

2. The shielded printed wiring board with a ground member according to claim 1, wherein an average circle-equivalent diameter of the cross sections of the electroconductive particles is twice or more a thickness of the protective layer of the shielding film.

3. The shielded printed wiring board with a ground member according to claim 1, wherein the electroconductive particles comprise at least one selected from the group consisting of copper, silver, nickel, silver-coated copper, silver-coated nickel, tin-coated copper, and tin-coated nickel.

4. The shielded printed wiring board with a ground member according to claim 1, wherein the external connection member comprises at least one selected from the group consisting of copper, silver, gold, aluminum, nickel, chromium, titanium, zinc, and stainless steel.

5. A ground member used for the shielded printed wiring board with a ground member according to claim 1, the ground member comprising:
an external connection member having a first main surface and a second main surface opposite to the first main surface, and having electroconductivity;
electroconductive particles disposed on the first main surface side; and
an adhesive resin for fixing the electroconductive particles to the first main surface,
wherein circularity of cross sections of the electroconductive particles in cross section of the ground member is 0.35 or more when the ground member is used for the shielded printed wiring board with a ground member.

6. The ground member according to claim 5, wherein peripheries of the electroconductive particles are surrounded by the adhesive resin.

7. The ground member according to claim 5, wherein at least a portion of the electroconductive particles are exposed from the adhesive resin.

8. A ground member, comprising:
an external connection member having a first main surface and a second main surface opposite to the first main surface, and having electroconductivity;
electroconductive particles disposed on the first main surface side; and
an adhesive resin for fixing the electroconductive particles to the first main surface, wherein circularity of cross sections of the electroconductive particles in a cross section of the ground member after compression bonding under the following compression bonding conditions is 0.35 or more:

pressurization conditions: a resin layer is provided in which an uncured epoxy resin is applied so as to have a thickness of 10 μm onto a layer comprising a cured epoxy resin and having a thickness of 6 μm; the resin layer is then arranged such that the layer comprising the cured epoxy resin faces upward, and the ground member is arranged thereon such that the first main surface of the external connection member faces downward; and the ground member is then compression bonded to the resin layer under conditions of 3 MPa and 30 minutes.

* * * * *

UNITED STATES PATENT AND TRADEMARK OFFICE
CERTIFICATE OF CORRECTION

PATENT NO. : 12,101,872 B2
APPLICATION NO. : 18/044436
DATED : September 24, 2024
INVENTOR(S) : Yuusuke Haruna Page 1 of 1

It is certified that error appears in the above-identified patent and that said Letters Patent is hereby corrected as shown below:

On the Title Page

Item (54) and in the Specification, Column 1, Lines 1-3, The title is corrected from "Shield Printed Wiring Board With Ground Member and Ground Member" to "Shielded Printed Wiring Board With Ground Member and Ground Member"

Signed and Sealed this
Twenty-second Day of October, 2024

Katherine Kelly Vidal
*Director of the United States Patent and Trademark Office*